United States Patent
Lin et al.

(10) Patent No.: US 8,085,611 B2
(45) Date of Patent: Dec. 27, 2011

(54) TWISTED DATA LINES TO AVOID OVER-ERASE CELL RESULT COUPLING TO NORMAL CELL RESULT

(75) Inventors: Yung Feng Lin, Dasi Township, Taoyuan County (TW); Kuen-Long Chang, Taipei (TW); Chun Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 200 days.

(21) Appl. No.: 12/545,793

(22) Filed: Aug. 21, 2009

(65) Prior Publication Data

US 2010/0182834 A1    Jul. 22, 2010

Related U.S. Application Data

(60) Provisional application No. 61/146,378, filed on Jan. 22, 2009.

(51) Int. Cl.
*G11C 7/00* (2006.01)

(52) U.S. Cl. ........... 365/207; 365/206; 365/63; 365/210
(58) Field of Classification Search .................. 365/207, 365/206, 210, 63
See application file for complete search history.

(56) References Cited

U.S. PATENT DOCUMENTS

| | | | |
|---|---|---|---|
| 5,732,010 A * | 3/1998 | Takashima et al. | 365/63 |
| 6,504,778 B1 * | 1/2003 | Uekubo | 365/189.15 |
| 6,721,198 B2 * | 4/2004 | Kang | 365/145 |
| 6,982,908 B2 * | 1/2006 | Cho | 365/158 |

* cited by examiner

*Primary Examiner* — Son Dinh
(74) *Attorney, Agent, or Firm* — Stout, Uxa, Buyan & Mullins, LLP

(57) ABSTRACT

Over-erasure induced noise on a data line in a nonvolatile memory that couples into an adjacent data line is mitigated by using twisted data lines and differential sensing amplifiers. Noise coupled into data lines is compensated by similar noise coupled into reference data lines and cancelled in the differential sensing amplifiers.

21 Claims, 5 Drawing Sheets

US 8,085,611 B2

TWISTED DATA LINES TO AVOID OVER-ERASE CELL RESULT COUPLING TO NORMAL CELL RESULT

CROSS-REFERENCE TO RELATED APPLICATIONS

This application claims the benefit of U.S. Provisional Application No. 61/146,378, filed Jan. 22, 2009, the entire contents of which are hereby incorporated by reference.

BACKGROUND OF THE INVENTION

1. Field of the Invention

The present invention relates generally to semiconductor memories and, more particularly, to non-volatile flash memories.

2. Description of Related Art

Non-volatile semiconductor memory devices are designed to maintain programmed information even in the absence of electrical power. Non-volatile memories in common use today include read-only memories (ROMs) that typically are programmed to store a fixed bit pattern at the time of manufacture and that cannot be reprogrammed subsequently. Programmable read-only memories (PROMs) are a form of field-programmable memory devices that can be programmed once by a PROM programmer. Erasable programmable read-only memories (EPROMs) are programmable like PROMs, but can also be erased, for example, by exposure to ultraviolet light that places all bits in the memory to a known state (e.g., a logic 1). Electrically erasable programmable read-only memories (EEPROMs) are similar to EPROMs except that individual stored bits can be erased electrically. A particular form of EEPROM, known as a flash memory, typically is erased in blocks, although flash memory cells can be programmed individually.

An individual flash memory cell normally is programmed by applying programming voltages to terminals of the device, which injects charge into a charge-trapping portion of the memory cell and modifies a threshold voltage $V_t$ of the cell. When the $V_t$ is programmable to a value in one of two distinguishable ranges, then the cell, which has been referred to as a single-level cell (SLC), is able to store one bit of data (e.g., "1" or "0"). It is common practice for an unprogrammed (i.e., erased) SLC to be considered as storing a data value of "1."

A flash memory cell can be read by applying read voltages to the terminals of the device and detecting a level of current in a drain circuit, thereby inferring a value for the $V_t$ of the cell. An erased or unprogrammed cell can have a $V_t$ near zero volts, while the $V_t$ of a programmed SLC might be 3 V, as an example. For such an SLC, applying a reading voltage of about zero to an unprogrammed cell is expected to result in a detectable drain current, corresponding to a stored data value of "1." Applying the same reading voltage to a programmed cell typically results in no detectable drain current, corresponding to a stored data value of "0."

Operation of an SLC as just described assumes that an erased cell has a threshold voltage near zero. Unfortunately, while erasing a cell ideally results in a near-zero threshold voltage, a cell may be over-erased in some instances, so that the threshold voltage can actually be negative. Programming an over-erased cell may result in a threshold voltage distribution that is displaced relative to a desired level, which displacement is a potential source of error when reading data from the memory.

A need thus exists in the prior art for methods and apparatus suitable for avoiding errors when reading over-erased cells in flash memories.

SUMMARY OF THE INVENTION

The present invention addresses this need by providing, according to one embodiment, a memory device comprising a memory array that includes a plurality of blocks, wherein each block includes a plurality of bit lines. The embodiment comprises a plurality of sense amplifiers, each sense amplifier having a first input for receiving a cell signal from the memory array and a second input for receiving a reference signal. The embodiment further comprises a plurality of data lines respectively coupled to deliver cell signals from a first set of bit lines in the memory array to the first inputs of the sense amplifiers and a plurality of reference data lines configured to connect the second inputs to a second set of bit lines in the memory array.

In an embodiment of the present invention, the first set is allocated in one or more first blocks, and the second set is allocated in one or more second blocks different from the first blocks.

In another embodiment of the present invention, bit lines of the first set are allocated in a plurality of different blocks, and bit lines of the second set are disposed to lie near to the bit lines in the first set, respectively.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Figure 1:
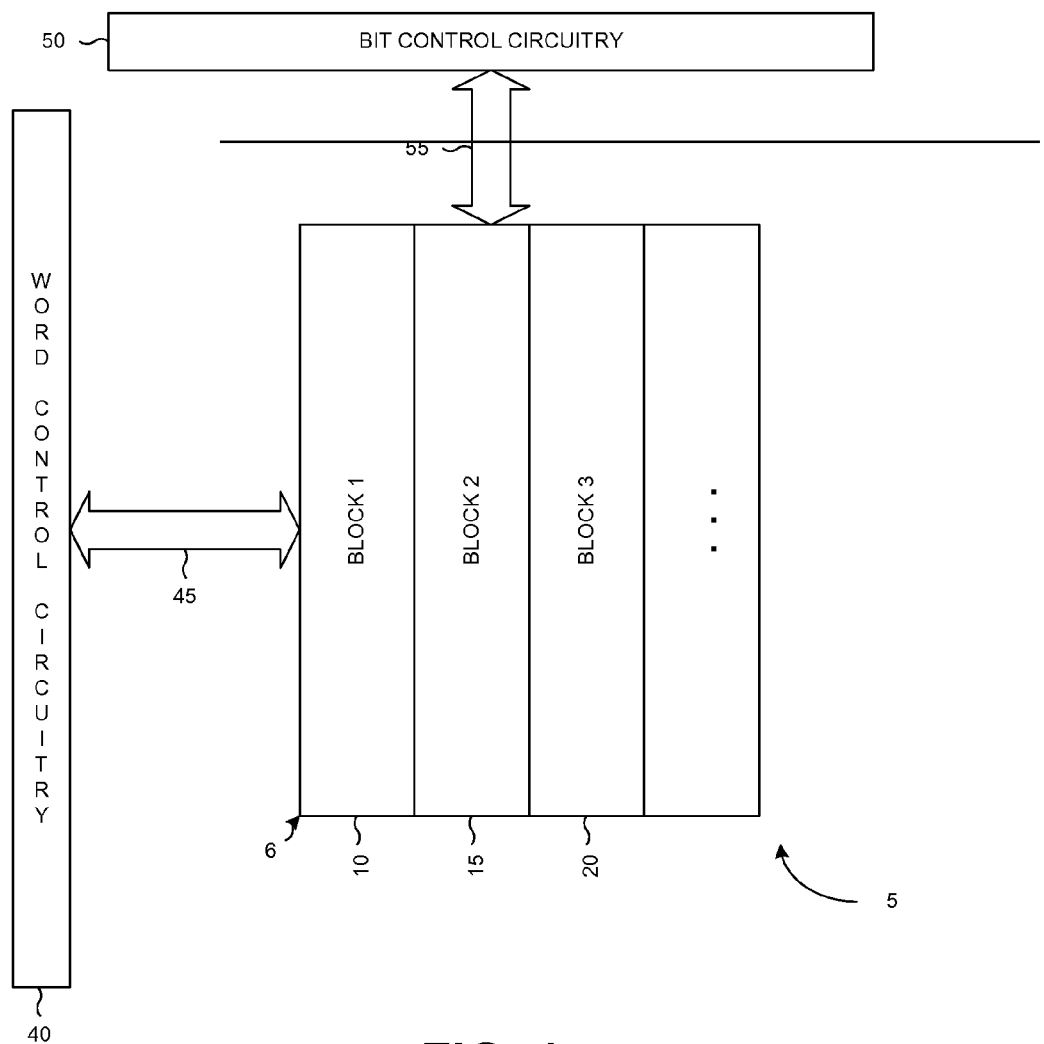
FIG. 1 is a block diagram of a portion of an example of a flash memory device having block portions.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete description of the disclosed steps and structures. The present invention may be practiced in conjunction with various integrated circuit techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a semiconductor memory device and a related method.

Referring more particularly to the drawings, FIG. 1 is a block diagram of a portion of an example of a flash memory device 5. The device 5 comprises word control circuitry 40, bit control circuitry 50 and a memory array 6 organized into blocks 1, 2, 3 . . . designated as 10, 15, 20 . . . , respectively. The memory 5 can be erased, programmed, and read using any of several methods, depending upon the precise form of memory cells making up the device, these methods being known and understood by those skilled in the art. Normally, erasing takes place on a block-by-block basis, while programming may be accomplished by selecting a word in a block of the memory array 6 using control signals communicated by word control circuitry 40 over a word control bus 45 connecting the word control circuitry 40 to the memory array 6. With a word selected, the bit control circuitry 50 may communicate data values to the selected word over a bit control bus 55.

Figure 2:
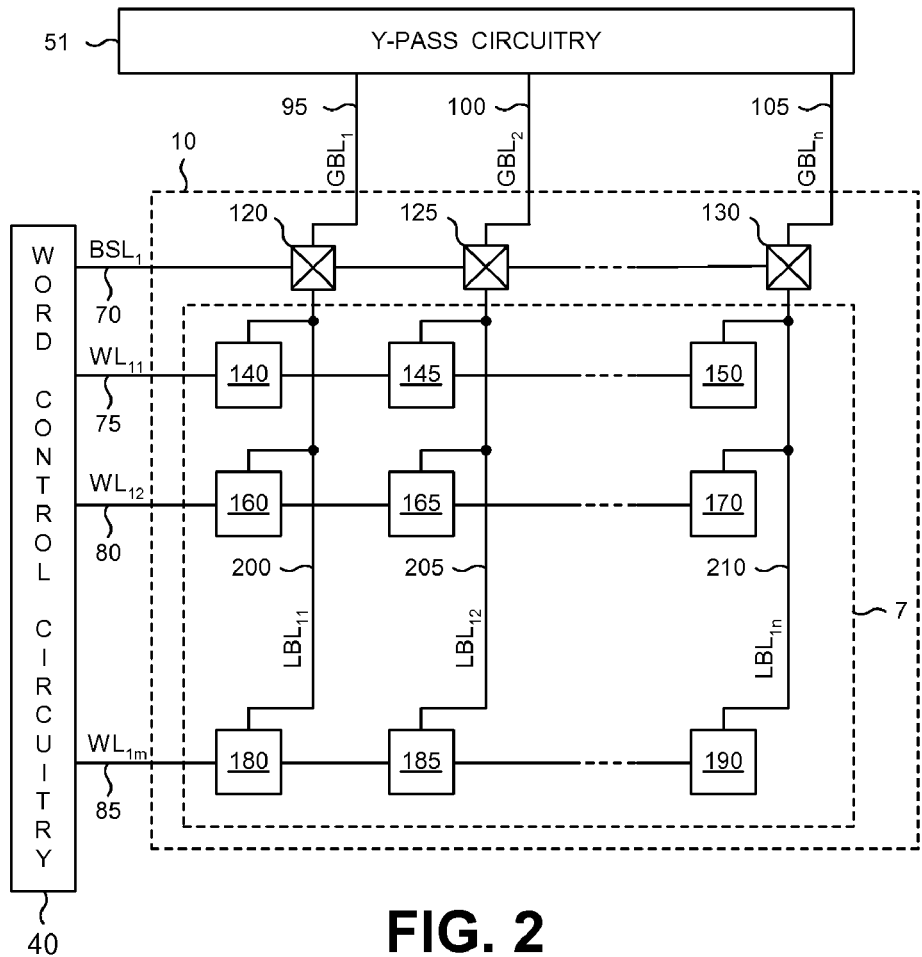
FIG. 2 is a simplified schematic diagram of one embodiment of a block portion of the memory device of FIG. 1.
Figure 3:
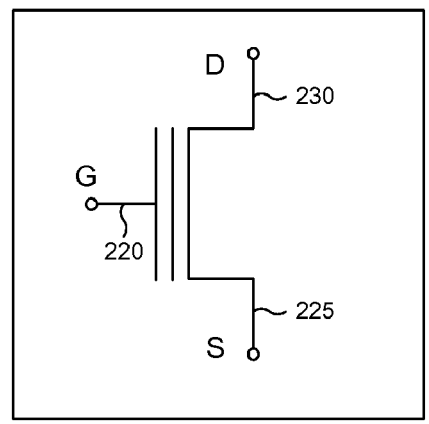
FIG. 3 diagrams a typical cell in the block portion of the memory array illustrated in FIG. 2.

FIG. 2 is a simplified schematic diagram of one embodiment of a block 10 (e.g., block 1 of FIG. 1) representing a portion of the memory array 6 (FIG. 1) for facilitating discussion of a read operation on the memory array 6. The illustrated embodiment of the block 10 comprises an m×n array 7 of memory cells, exemplified by cells 140, 145, 150, 160, 165, 170, 180, 185 and 190. The block 10 further comprises select transistors (STs) 120, 125, and 130 described more particularly below. A typical memory cell of the array 7, illustrated in FIG. 3, may comprise an NMOS transistor having a gate 220, source 225 and drain 230. An embodiment of the transistor may include, for example, a floating gate or other form of charge trapping structure suitable for storing charge as a memory cell. Rows of memory cells may be controlled by the word control circuitry 40, which may apply voltages to, for example, block select line 1 ($BSL_1$) 70 and one or more of m word lines (WLs), examples of which are $WL_{11}$ 75, $WL_{12}$ 80 and $WL_{1m}$ 85. Word line $WL_{11}$ 75, for example, may be connected to the gates of transistors in cells 140, 145, and 150.

Columns of memory cells may be controlled by the bit control circuitry 50 (FIG. 1), which may include Y-pass circuitry 51 connected to the array 7 through a first set of bit lines, e.g., global bit lines (GBLs) such as $GBL_1$ 95, $GBL_2$ 100 and $GBL_n$ 105. A second set of bit lines (not shown) also may connect to the Y-pass circuitry 51 as is described more particularly below with reference to FIG. 4. The GBLs in FIG. 2 may connect to local bit lines (LBLs), examples of which are $LBL_{11}$ 200, $LBL_{12}$ 205 and $LBL_{1n}$ 210, through select transistors (STs) exemplified by STs 120, 125 and 130. Each ST may comprise a gate terminal connected to $BSL_1$ 70. Each ST further may comprise a drain terminal that connects to a GBL and a source terminal that connects to a corresponding LBL. For example, ST 120 may have its drain terminal connected to $GBL_1$ 95 and its source terminal connected to $LBL_{11}$ 200.

Memory cells disposed in a column of the array 7 are connected together by their drains to an LBL, according to the column in which the memory cells are located. That is, the drains of transistors 140, 160 and 180 connect to $LBL_{11}$ 200, the drains of transistors 145, 165 and 185 connect to $LBL_{12}$ 205, and so on. The sources of all memory cells in the block are connected to a common source line (not shown), which may be grounded during a read operation. The Y-pass circuitry 51 may control connections between the GBLs of a block (e.g. block 10) and sense amplifiers and decision circuitry as is more particularly described below with reference to FIG. 4.

When the word control circuitry 40 applies a select voltage (e.g., a positive voltage) to $BSL_1$ 70, the STs to which $BSL_1$ 70 is connected may turn ON, effectively connecting LBLs to corresponding GBLs. For example, ST 120 may connect $GBL_1$ 95 to $LBL_{11}$ 200, ST 125 may connect $GBL_2$ 100 to $LBL_{12}$ 205, and so on.

Reading data from the block 10 (cf. Block 1 of FIG. 1) in the embodiment of FIG. 2 may be accomplished, according to a representative method, by applying a select voltage to $BSL_1$ 70 to select the block 10, grounding the common source line (not shown), deselecting all other blocks (by applying a deselect voltage, e.g., a negative voltage, to the BSLs in the other blocks), and applying read bias voltages to the cells in a selected row of the array 7. For example, a word line, e.g., $WL_{11}$ 75, may be selected according to a row of the memory to be read. A read voltage may then be applied to the selected word line by the word control circuitry 40 while, for example, a zero voltage may be applied to all other word lines in the block 10. The bit control circuitry 50 (FIG. 1) may, at the same time, apply a positive read voltage to the GBLs, e.g., $GBL_1$ 95, $GBL_2$ 100 and $GBL_n$ 105. With the indicated bias voltages applied, transistors in the selected row and in each column of the array may pass current according to their program state. That is, in an ideal situation, any programmed cell passes no detectable current, while unprogrammed cells may pass current that is directed by, e.g., STs 120, 125 and 130 to respective GBLs $GBL_1$ 95, $GBL_2$ 100 and $GBL_n$ 105. The bit control circuitry 50 (FIG. 1) may make a determination about the program state of each transistor in the selected row according to a level of current observed in the GBLs.

In practice, GBL current may not be measured directly by the bit control circuitry 50 (FIG. 1), but may be compared to a reference current as described below with reference to FIG. 4. The reference current may be chosen to be greater than the current expected from an unprogrammed memory cell but less than the current expected from a programmed memory cell. Comparing current in a particular GBL (e.g., $GBL_1$ 95, $GBL_2$ 100 or $GBL_n$ 105) of the structure of FIG. 2 may permit a determination of the program state of a memory element in a selected row of the array. For example, with read voltages applied as described, the bit control circuitry 50 (FIG. 1) may decide that cell 140 is programmed if the current in $GBL_1$ 95 is less than the reference current. Conversely, if the current in, for example, $GBL_2$ 100 is greater than the reference current, then the bit control circuitry 50 (FIG. 1) may decide that cell 145 is unprogrammed.

Figure 4:
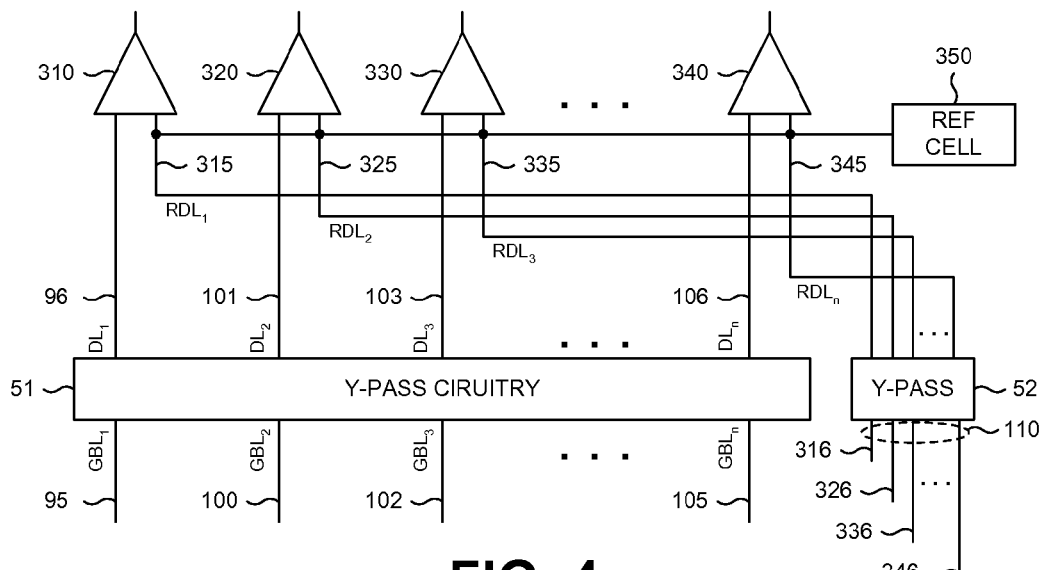
FIG. 4 is a block diagram of an apparatus configured to read a program state of memory cells in a selected row of the block portion of the memory array of FIG. 2.

One embodiment of an apparatus that may read the program state of memory cells in a selected row of the array 7 (FIG. 2) is illustrated in FIG. 4. The embodiment comprises Y-pass circuitry 51 that includes a switching arrangement adapted to connect GBLs of a selected block of a memory array (e.g., memory array 6 of FIG. 1) to data lines (DLs). As an example, the Y-pass circuitry 51 in the illustrated embodiment connects $GBL_1$ 95, to $DL_1$ 96, $GBL_2$ 100 to $DL_2$ 101, and so on. The embodiment further comprises a collection of sense amplifiers 310, 320, 330 and 340 configured to receive, on first (e.g., non-inverting) inputs, a current from respective DLs, $DL_1$ 96, $DL_2$ 101, $DL_3$ 103 and $DL_n$ 106. The same sense amplifiers receive, on second (e.g., inverting) inputs, currents from reference data lines (RDLs) that reflect a value of one or more (e.g., a) reference signals. The reference signal in one embodiment may be generated by a reference current source. In another embodiment, as illustrated in FIG. 4, the reference signal may come from a reference cell 350. Accordingly, outputs of sense amplifiers having a larger current on a DL input than on an RDL input may generate distinctive outputs corresponding to cells in the selected word that are unprogrammed. Conversely, outputs of sense amplifiers having a smaller current on a DL input than on an RDL input may generate outputs corresponding to programmed cells in the selected word. In other embodiments, the bit control circuitry 50 (FIG. 1) and/or the Y-pass circuitry 51 and 52 (FIGS. 2 and 4) may include structure (e.g., switching arrangements) whereby one or more GBLs can be chosen (e.g., selected or connected) to be reference GBL(s). In such an arrangement, a first set of bit lines (e.g., GBLs 95, 100, 102 and 105) may communicate cell signals from a memory array (e.g., array 7 in FIG. 2) to the data line inputs (e.g., DLs 96, 101, 103 and 106) of the sense amplifiers (e.g., sense amplifiers 310, 320, 330 and 340 in FIG. 4), and a second set of bit lines (e.g., reference GBLs 316, 326, 336, and 346) designated collectively in FIG. 4 by reference designator 110) may present impedance (i.e., resistance and capacitance) that effectively matches that of the first set of bit lines, thereby enabling an increase in reading speed of the memory device. It should be noted that the bit lines in the second set do not provide reference signals. In particular, one or more switches (not shown), which may be implemented by transistors similar, for example, to STs 120, 125 and 130, may be configured to disconnect (i.e., open a connection to) bit lines in the second set from power or from memory cells with which they may be associated when they are acting as reference GBLs. Provision of RDLs and connection of RDLs to GBLs may improve a balance of capacitance and resistance loading, (i.e., "loading matching," or "loading balance") between a reference side and a sensing side of differential sense amplifier inputs, thereby increasing sensing speed. When a GBL is not connected to memory cells, but is connected to an RDL, the GBL may be used for loading balance between the reference side and the sensing side of a sensing amplifier.

Figure 5:
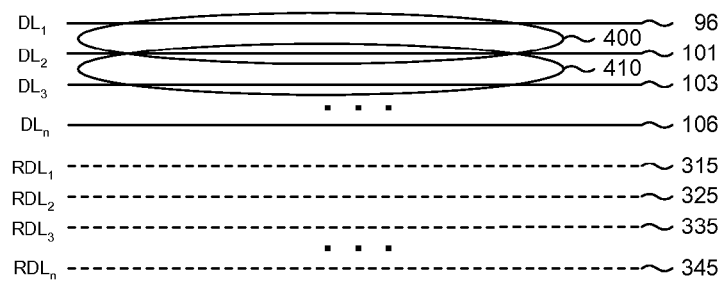
FIG. 5 is a schematic diagram corresponding to a data line portion of a flash memory device to emphasize physical spacing and layout features of the lines.

FIG. 4 represents a simplified block diagram of an embodiment of a memory reading apparatus. When implemented in an integrated circuit, a conventional layout of, for example, the data lines (DLs) and reference data lines (RDLs) of FIG. 4 may place the lines in a parallel orientation as illustrated in FIG. 5, which emphasizes physical spacing and layout of the lines. For example, $DL_1$ 96 may be relatively near and parallel to $DL_2$ 101, $DL_2$ 101 may be relatively near and parallel to $DL_3$ 103, and so on. Similarly, $RDL_1$ 315 may be relatively near and parallel to $RDL_2$ 325, $RDL_2$ 325 may be relatively near and parallel to $RDL_3$ 335, and so on. Many variations of the arrangement of DLs and RDLs are possible, as will be understood by those skilled in the art in light of this disclosure. For example, DLs and RDLs may be interleaved or not, the order of DLs and RDLs may differ from that illustrated in FIG. 5, and the DLs may run on a single semiconductor layer or in different layers that may or may not be the same layer(s) that support(s) the RDLs.

The previously-described apparatus and method may be suitable for reading data from programmed/unprogrammed memory cells in an idealized situation. In practice, however, due to previous use, some cells in the array 7 (FIG. 2) may have become over-erased. That is, the cells may store an excess positive charge that may accumulate through repeated erasures of the array. An over-erased cell may pass a relatively large current in response to read bias voltages applied to the cells.

Existing methods for compensating or factoring-in this over-erase issue may include using column repair and replacing results in sense amplifier outputs as well as electrically blocking results of over-erased cells using extra column direction pass gates driven by redundancy information. However, such methods may suffer from one or more of being expensive and causing read speed to deteriorate. Such existing methods, however, do not prevent another source of error relating to over-erased cells, which error is an undesirable coupling effect from over-erased cells to normal cells. For example, as illustrated schematically in FIG. 5, signals on one line may couple, due, in part, for example, to capacitive effects, to another line where they may appear as noise. In particular, signals generated on lines connected to over-erased cells may appear as interference (e.g., noise) on adjacent lines. In the figure, $DL_1$ 96 is disposed to lie near and parallel to $DL_2$ 101. When so disposed, coupling between $DL_1$ 96 and $DL_2$ 101 may occur in a region indicated on the diagram by reference designator 400. Similarly, coupling between, say, $DL_2$ 101 and $DL_3$ 103 may occur in a region 410 as illustrated.

Figure 6A:
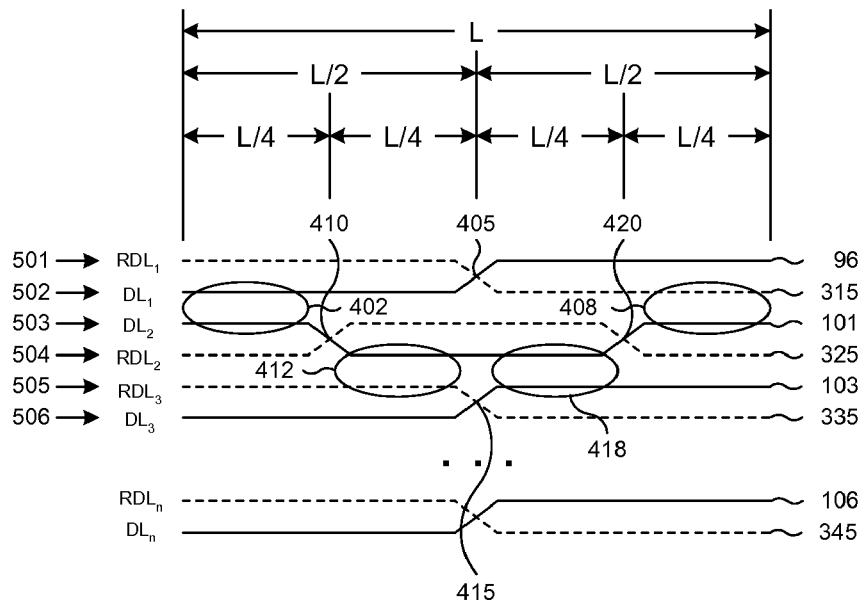
FIG. 6A is a schematic diagram corresponding to an embodiment of a layout of data lines and reference data lines according to the present invention.

FIG. 6A is a schematic diagram illustrating an embodiment of an arrangement of data lines and reference data lines according to the present invention. As shown, $RDL_1$ 315 and $DL_1$ 96 are disposed to lie on nominally parallel paths 501 and 502 of approximate length L and having a first crossover point 405 located at a distance of about L/2 from ends of the lines. That is, working from left to right, $RDL_1$ 315 begins on first path 501, extends a distance of about L/2 to the first crossover point 405 and continues along a second path 502, while $DL_1$ 96 begins on the second path 502, extends a distance of about L/2 to the first crossover point 405 and continues on the first path 501. The crossover, which may effectively implement a "twist" in the arrangement of $RDL_1$ 315 and $DL_1$ 96, may be accomplished, for example, by locating the first path on a first semiconductor layer, locating the second path on a second semiconductor layer, which may be lower or higher than the first semiconductor layer, and providing a between-layer connection at the crossover point 405 in order to avoid shorting.

The layout illustrated in FIG. 6A further comprises $DL_2$ 101 and $RDL_2$ 325 disposed to lie on paths 503 and 504, which are nominally adjacent to and parallel to paths 501 and 502. That is, $DL_2$ 101 and $RDL_2$ 325, lie on paths 503 and 504 having approximate length L and have respective second and third crossover points 410 and 420 located at a distance of about L/4 from each end of the lines. More precisely, $DL_2$ 101 begins, in this example, on third path 503 and extends rightward a distance of about L/4 to the second crossover point 410, continues on fourth path 504 rightward for a distance of about L/2 to the third crossover point 420 and continues along the third path 503. $RDL_2$ 325 begins on the fourth path 504, extends rightward a distance of about L/4 to the second crossover point 410, continues along the third path 503 rightward for a distance of about L/2 to the third crossover point 420 and continues on the fourth path 504.

Following the pattern established by $DL_1$ 96, $RDL_1$ 315, $DL_2$ 101 and $RDL_2$ 325, $RDL_3$ 335 begins on fifth path 505, extends rightward for a distance of about L/2 to a fourth crossover point 415 and continues rightward on sixth path 506. $DL_3$ 103 begins on the sixth path 506, extends rightward for distance of about L/2 to the fourth crossover point 415 and continues rightward on the fifth path 505.

Generally, a layout similar to that illustrated in FIG. 6A may exhibit a symmetry having beneficial effects in the operation of a memory device that employs the symmetrical layout. To articulate one such feature/implementation of symmetry, a line segment (not shown) extending from the fourth crossover point 415 to the first crossover point 405 may approximately bisect a line segment (not shown) joining the second crossover point 410 with the third crossover point 420.

The layout (e.g., symmetrical layout) of lines in the example just described may reduce effects of coupling between adjacent and/or parallel lines. For example, coupling between $DL_2$ 101 to $DL_1$ 96 may be confined to a region 402 where, for example, noise caused by an over-erasure on $DL_2$ 101 may be coupled into $DL_1$ 95. Moreover, a similar coupling may occur in a region 408, whereby the same noise related to an over-erasure on $DL_2$ 101 may be coupled into $RDL_1$ 315. As a consequence, approximately the same noise may appear on both the inverting and non-inverting inputs of sense amplifier 310 (FIG. 4) so that an effect of the noise is at least partially cancelled in the differential amplifier, thereby reducing influence of the noise on a read decision based upon data on $DL_1$ 96.

In another embodiment, one, a plurality of, or each DL in FIG. 6A may be replaced by one or more DLs connected to a corresponding first bit line(s), e.g., GBL(s) disposed, for instance, in a first set of bit lines. Similarly, one, a plurality of, or each RDL may be replaced by one or more RDLs connected to a corresponding second bit line(s), which may be GBL(s) and which may be disposed in a second bit line set. In this other embodiment, each DL and its connected bit line may have a length about equal to that of a corresponding RDL and its connected bit line in order to provide impedance matching as described above.

The arrangement illustrated in FIG. 6A may be contrasted with the arrangement shown in FIG. 5. In particular, with the arrangement of FIG. 5, significant coupling may exist between $DL_1$ 96 and $DL_2$ 101 in the region 400 (due to their relatively close proximity) while very little or no coupling may be observed between $DL_1$ 96 and $RDL_2$ 325 as a consequence of $RDL_2$ 325 being located at a relatively farther distance from $DL_1$ 96 than is $DL_2$ 101. Accordingly, for example, if a sensed memory cell connected to $DL_2$ 101 is over-erased, then the $DL_2$ 101 may carry a relatively large current, which may adversely affect a current in $DL_1$ 96, thereby undesirably influencing a decision associated with $DL_1$ 96. With the arrangement of FIG. 6A, however, coupling from $DL_2$ 101 to $DL_1$ 96 in region 402 may be matched by coupling from $DL_2$ 101 to $RDL_1$ 315 in region 408 so that an effect of an over-erasure on $DL_2$ 101 may be effectively cancelled in the differential sense amplifier 320 (FIG. 4).

Figure 6B:
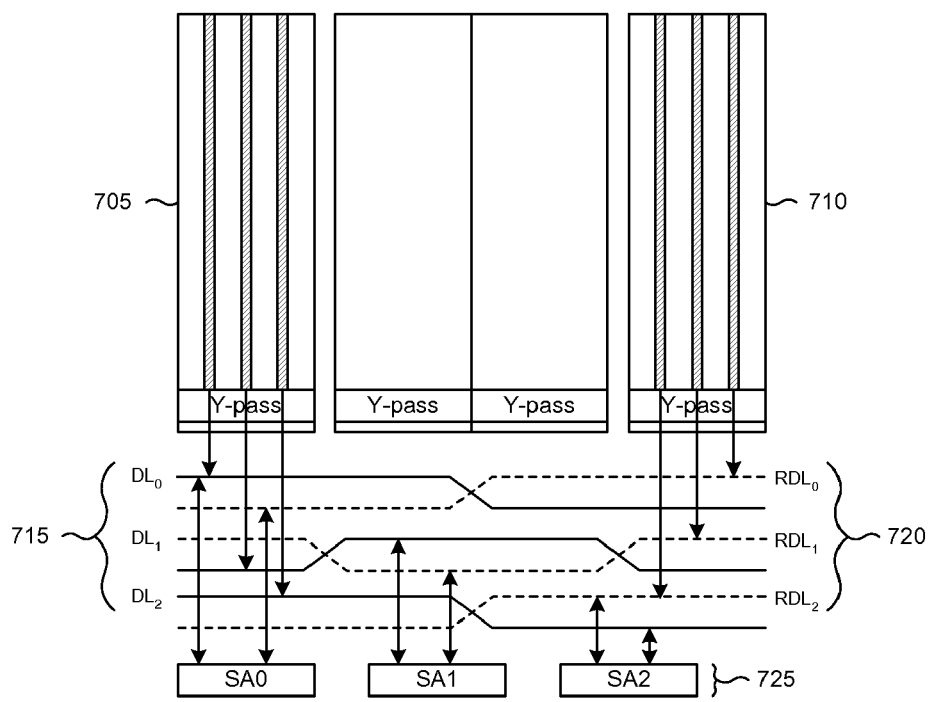
FIG. 6B is a another representation of the arrangement exemplified in FIG. 6A.

According to one embodiment, which comprises four blocks (cf. FIG. 1), the crossover points (e.g., 405, 410 and 420) in the layout may coincide with boundaries between blocks. Consequently, each of the neighboring DLs is affected in a quarter length (i.e., L/4), the effect being compensated by a complementary effect on a corresponding RDL. An example is illustrated in FIG. 6B, which can be considered as an expanded implementation of the schematic diagram of FIG. 6A, depicting blocks containing global bit lines (GBLs) 705, reference GBLs (RGBLs) 710, data lines (DLs) 715, reference data lines (RDLs) 720 and an interconnecting arrangement among the aforementioned elements and sense amplifiers 725. In this and similar embodiments, the location of twisting points may depend upon the location or numbers of memory blocks.

A similar consideration may apply regarding any noise coupling from, for example, $DL_2$ 101 to $DL_3$ 103. That is, with the arrangement of FIG. 6A, any over-erasure-induced noise from, say, $DL_2$ 101 that couples into $DL_3$ 103 in region 418 may be matched by similar noise from $DL_2$ 101 that couples into $RDL_3$ 335 in region 412. Again, differential action of sense amplifier 330 may act to reduce or cancel an effect of the noise that appears on both the inverting ($RDL_3$ 335) and non-inverting ($DL_3$ 103) inputs of sense amplifier 330, thereby improving reliability of a read decision based upon a signal on $DL_3$ 103.

Figure 7:
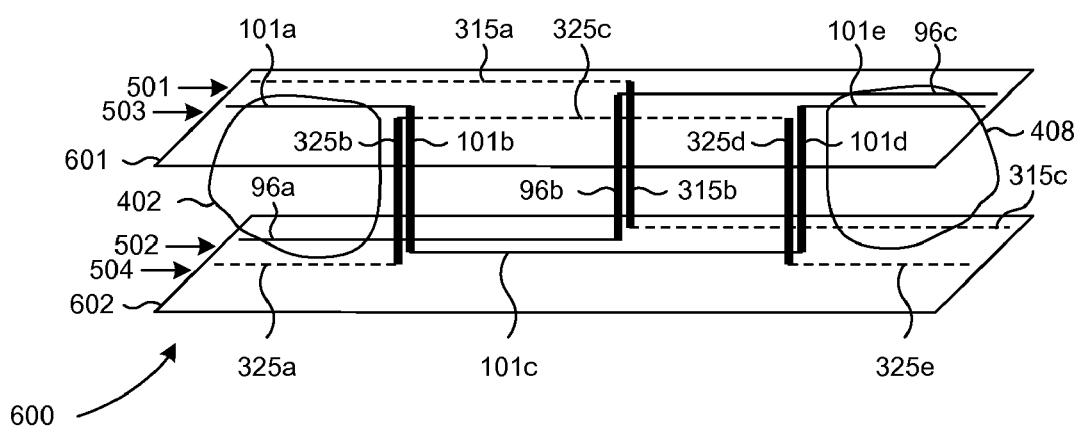
FIG. 7 is a pictorial perspective view of a portion of the schematic diagram of FIG. 6A implemented on two semiconductor layers.

As a further illustration, FIG. 7 provides an idealized perspective view of a particular embodiment 600 of the arrangement illustrated schematically in FIG. 6A. The embodiment of FIG. 7 comprises an upper layer 601 and a lower layer 602 of a semiconductor structure having data lines and reference data lines disposed thereon. In the example, reference data line $RDL_1$ 315 (FIG. 6A), which forms a pair with data line $DL_1$ 96 (FIG. 6A), comprises first segment 315a and second segment 315c, one on each layer, the two segments being connected by an inter-layer connector 315b. The first segment 315a, which may have a nominal length of L/2, is disposed in a first path 501 on the upper layer 601. The second segment 315c, which likewise may have a nominal length of L/2, is disposed in a second path 502 on the lower layer 602. Data line DL$_1$ 96 likewise comprises two segments, each having a length of about L/2, the first segment 96a being disposed in the second path 502 on the lower layer 602, nominally parallel to the first segment 315a, and the second segment 96c being disposed in the first path 501 on the upper layer 601 nominally parallel to the second segment 315c. The first segment 96a and second segment 96c of DL$_1$ 96 are connected by an inter-layer connector 96b. The inter-layer connectors 351b and 96b are located at approximate midpoints of RDL$_1$ 315 and DL$_1$ 96.

In a similar manner, a DL/RDL pair formed by DL$_2$ 101 and RDL$_2$ 325 (FIG. 6A) may be arranged according to that suggested schematically in FIG. 6A. In particular, DL$_2$ 101 may be divided into three segments, a first segment 101a having a length of about L/4, a second segment 101c having a length of about L/2, and a third segment 101e having a length about L/4. The first segment 101a may be disposed in a third path 503 on the upper layer 601, the second segment 101c may be disposed in a fourth path 504 on the lower layer 602, and the third segment 101e may be disposed in the third path 503 on the upper layer 601. A layout for RDL$_2$ 325 may be chosen to be complementary to the layout of DL$_2$ 101. That is, RDL$_2$ 325 may be divided into three segments, 325a, 325c, and 325e having respective lengths of about L/4, L/2, and L/4 and arranged to be nominally parallel to corresponding segments of DL$_2$ 101 but on opposite layers of the semiconductor structure 600.

With the arrangement illustrated in FIG. 7, coupling, for example, in region 402 between DL$_2$ 101 and DL$_1$ 96 may be matched by coupling occurring in region 408 to yield beneficial effects as already described above with reference to FIG. 6A.

In some embodiments, a portion of a first set of bit lines, e.g., GBL$_1$ 95, GBL$_2$ 100 and GBL$_3$ 100 (FIG. 4), may be allocated in a first block (e.g., block 1, designated as 10 in FIG. 1) and another portion (not shown) of the first set of bit lines may be allocated in a second block (e.g., block 3, designated as 20 in FIG. 1). The first set of bit lines may be connected by the Y-pass circuitry 51 (FIG. 4) to data lines, including, for example, DL$_1$ 96, DL$_2$ 101 and DL$_3$ 103. A second set of bit lines, which may be near the bit lines in the first set of bit lines, may be connected by the Y-pass circuitry 52 to reference data lines that may include, for example, RDL$_1$ 315, RDL$_2$ 325 and RDL$_3$ 335. The first set of bit lines may be disposed to lie near the second set of bit lines. For example, each bit line in the second set of bit lines may lie near to a bit line in the first set of bit lines. The data lines may communicate cell signals from the first set of bit lines to first inputs of sense amplifiers exemplified by 310, 320 and 330. The reference data lines may communicate a reference signal from the reference (e.g., reference cell 350 in FIG. 4) to second inputs of the same sense amplifiers 310, 320 and 330. Typically, a data line connects to a first bit line, and a corresponding reference data line connects to a second bit line to provide an impedance that, at least approximately, matches that of the first bit line. A connection formed by the data line and the first bit line may have about the same length as that of a connection formed by the reference data line and the second bit line. In some embodiments, the first and second inputs of the sense amplifiers may be interchanged, effectively operating DL inputs as RDL inputs and vice versa. In a modified embodiment, the reference cell 350 (FIG. 4) or reference current source may connect to either the first or second inputs of the sense amplifiers 310, 320, 330 and 340 (FIG. 4).

In view of the foregoing, it will be understood by those skilled in the art that the methods of the present invention can facilitate formation of flash memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A memory device, comprising:
  a memory array including a plurality of blocks each having a plurality of bit lines;
  a plurality of sense amplifiers each having a first input for receiving a cell signal from the memory array and a second input for receiving a reference signal;
  a plurality of data lines respectively coupled to deliver cell signals from a first set of bit lines in the memory array to the first inputs; and
  a plurality of reference data lines configured to connect the second inputs to a second set of bit lines in the memory array, wherein the second input receives the reference signal through a path different from the plurality of reference data lines.

2. The memory device as set forth in claim 1, wherein:
  the first set is allocated in one or more first blocks; and
  the second set is allocated in one or more second blocks different from the first blocks.

3. The memory device as set forth in claim 1, wherein bit lines of the first set are allocated in a plurality of different blocks, and bit lines of the second set are disposed to lie near to the bit lines in the first set, respectively.

4. The memory device as set forth in claim 1, wherein each bit line of the second set is positioned to lie near a bit line in the first set.

5. The memory device as set forth in claim 1, further comprising one or more switches configured to disconnect each bit line of the second set from an associated memory cell.

6. The memory device as set forth in claim 1, wherein:
  the plurality of data lines connect to the first set of bit lines;
  the plurality of reference data lines connect to the second set of bit lines; and
  a length primarily consisting of one data line and its connected bit line is about the same as a length primarily consisting of a reference data line and its connected bit line.

7. The memory device as set forth in claim 1, wherein the reference signal comprises one or more signals from one or more reference cells.

8. The memory device as set forth in claim 1, wherein the reference signal comprises one or more signals from one or more reference current sources.

9. The memory device as set forth in claim 1, wherein:
  a data line connects to a first bit line;
  reference data line connects to a second bit line; and
  a length of the data line and the first bit line connected together is about equal to a length of the reference data line and the second bit line connected together.

10. A memory device, comprising:
  a memory array including a plurality of blocks each having a plurality of bit lines;
  a sense amplifier having a first input for receiving a cell signal from the memory array and a second input for receiving a reference signal;

a data line arranged to deliver the cell signal from a first bit line in the memory array to the first input; and a reference data line that connects the second input to a second bit line in the memory array, the data line of a first pair includes a first segment that begins on a first path and continues to the first crossover point, and a second segment that begins at the first crossover point and lies on a second path, the first and second segments being joined at the first crossover point; and the reference data line of the first pair includes a third segment that begins on the second path and continues to the first crossover point, and a fourth segment that begins at the first crossover point and lies on the first path, the third and fourth segments being joined at the first crossover point.

11. The memory device as set forth in claim 10, further comprising:

a plurality of sense amplifiers having a plurality of respective first and second inputs;

a plurality of data lines arranged to deliver a plurality of cell signals from the plurality of bit lines to the plurality of first inputs; and a plurality of reference data lines configured to enable communication of one or more reference signals to the plurality of second inputs.

12. The memory device as set forth in claim 11, wherein:

each of the data lines corresponds to one of the reference data lines;

each data line and the corresponding reference data line form a pair; and the data line and reference data line forming each pair are disposed to lie on nominally parallel paths and to have a first crossover point.

13. The memory device as set forth in claim 11, wherein an effect of noise, which originates in a data line in a second pair and which is coupled into the data and reference data lines of the first pair, is reduced at an output of a differential sense amplifier.

14. The memory device as set forth in claim 13, wherein the noise is caused by at least one over-erased cell in the memory device.

15. The memory device as set forth in claim 11, wherein the data line and reference data line forming each pair have at least one crossover point.

16. The memory device as set forth in claim 15, wherein the data line and reference data line forming each pair each comprise a number of segments equal to one plus the number of crossover points.

17. The memory device as set forth in claim 15, wherein the data lines and reference data lines are symmetrically arranged to facilitate cancellation at differential sense amplifier outputs of noise in a first data line caused by over-erasure of a memory cell connected to a second data, line.

18. A memory device, comprising:

a plurality of memory cells;

a plurality of sense amplifiers having inverting and non-inverting inputs, outputs of the sense amplifiers being responsive to a difference between signals on the inverting and non-inverting inputs;

a plurality of data lines configured to communicate data signals to one of the inserting and non-inverting inputs according to memory states of the memory cells; and a plurality of reference data lines configured to communicate with the other of the inverting and non-inverting inputs;

wherein the data lines and reference data lines are arranged in pairs such that a disturbance originating in a data line of a first pair and coupled to a data line of a second pair is matched by a similar disturbance coupled to a reference data line of the second pair, whereby an effect of the disturbance is reduced at an output of a sensing amplifier; and wherein the other of the inverting and non-inverting inputs receives a reference signal through a path different from the plurality of reference data lines.

19. The memory device as set forth in claim 18, wherein the data line and reference data line of a first pair are symmetrically disposed to facilitate matching of a disturbance coupled to the data line of the first pair from a data line of a second pair with a similar disturbance coupled to the reference data line of the first pair.

20. The memory device as set forth in claim 18, wherein the data line and the reference data line of a pair are disposed to be nominally parallel and to have at least one crossover point.

21. The memory device as set forth in claim 18, wherein the reference data lines are configured to enable communication of one or more reference signals with the other of the inverting and non-inverting inputs.

* * * * *